(12) United States Patent
Ogura et al.

(10) Patent No.: US 6,735,118 B2
(45) Date of Patent: May 11, 2004

(54) CG-WL VOLTAGE BOOSTING SCHEME FOR TWIN MONOS

(75) Inventors: Nori Ogura, Hopewell Jct., NY (US); Seki Ogura, Hopewell Jct., NY (US)

(73) Assignee: Halo LSI, Inc., Wappingers Falls, NY (US)

( * ) Notice: Subject to any disclaimer, the term of this patent is extended or adjusted under 35 U.S.C. 154(b) by 0 days.

(21) Appl. No.: 10/190,690

(22) Filed: Jul. 8, 2002

(65) Prior Publication Data

US 2003/0007387 A1 Jan. 9, 2003

Related U.S. Application Data

(60) Provisional application No. 60/303,738, filed on Jul. 6, 2001.

(51) Int. Cl.$^7$ .............................................. G11C 11/34
(52) U.S. Cl. ............................... 365/185.18; 365/185.17
(58) Field of Search ........................ 365/185.18, 185.17

(56) References Cited

U.S. PATENT DOCUMENTS

| | | | |
|---|---|---|---|
| 6,011,725 A | | 1/2000 | Eitan ..................... 365/185.33 |
| 6,248,633 B1 | * | 6/2001 | Ogura et al. ................ 438/267 |
| 6,255,166 B1 | | 7/2001 | Ogura et al. ................ 438/257 |
| 6,531,350 B2 | * | 3/2003 | Satoh et al. ................ 438/197 |
| 6,531,732 B2 | * | 3/2003 | Sugita et al. ............... 257/315 |
| 6,549,463 B2 | * | 4/2003 | Ogura et al. ........... 365/185.18 |

OTHER PUBLICATIONS

U.S. patent application 10/099,030 dated Mar. 15, 2002 to S. Ogura et al., "Twin MONOS Memory Cell Usage for Wide Program", HALO–01–002.

U.S. patent application 09/810,122 dated Mar. 19, 2001 to S. Ogura, "Array Architecture of Nonvolatile Memory and its Operation Methods", HALO–00–004.

* cited by examiner

*Primary Examiner*—M. Tran
(74) *Attorney, Agent, or Firm*—George O. Saile; Stephen B. Ackerman

(57) ABSTRACT

This invention provides a circuit and a method for providing an override voltage to control gates through boosting of a selected word line for TWIN metal oxide, nitride semiconductor MONOS memory. The boosted voltages are required to program, erase and read the 2-bit MONOS memory cell in this invention. This invention relates to providing a means of using capacitive coupling between selected word lines and neighboring control gates to boost the voltage for the program, erase and write modes of MONOS memory. Capacitive coupling to boost the voltage on the control gates adjacent to the selected word lines is used instead of generating the required boosted voltage through the control gate and bit line decoders and drivers. This voltage boosting method saves address decoder silicon area, decoder circuit complexity, reduces address decode set-up time, and eliminates the need for extra voltage supplies for address decoders.

22 Claims, 7 Drawing Sheets

US 6,735,118 B2

CG-WL VOLTAGE BOOSTING SCHEME FOR TWIN MONOS

This application claims priority to U.S. Provisional Patent Application serial No. 60/303,738, filed on Jul. 6, 2001, which is herein incorporated by reference.

BACKGROUND OF THE INVENTION

1. Field of the Invention

This invention relates to a circuit and a method for providing an override voltage to control gates through boosting of a selected word line for TWIN metal oxide nitride oxide MONOS semiconductor memory.

More particularly this invention relates to providing a means of using capacitive coupling between selected word lines and neighboring control gates to boost the voltage for the program, erase or read modes of MONOS memory.

2. Description of Related Art

High density flash memory arrays have been described in previous patents.

U.S. Pat. No. 6,011,725 (Eitan) "Two Bit Non-volatile Electrically Erasable and Programmable Semiconductor Memory Cell Utilizing Asymmetrical Charge Trapping" describes a memory cell which uses charge trapping within various layers of the memory cell cross-section to store information. A single word gate has an underlying single oxide-nitride-oxide (ONO) composite layer in which electrons are trapped at two separate locations within the nitride layer. Thus, two hard bits of data can be stored under a single word gate, which roughly doubles the cell density.

The features of Twin MONOS memory cell structures distinctive of other flash and MONOS EEPROM cells, has been documented in U.S. Pat. No. 6,255,166 B1, "Nonvolatile memory cell, method of programming the same and nonvolatile memory array", by S. Ogura, et. al, and U.S. patent application Ser. No. 09/810122, "Array architecture of nonvolatile memory and operation method", by Y. Hayashi, et. al., submitted on Mar. 19, 2001. FIG. 1 gives a cross-section of a Twin MONOS memory array. A single memory cell CELL[x] is composed of a control gate CG[x], a bit diffusion junction BL[x] and two halves of a word gate. In particular, the 2-bit nature of a cell is allowed through its structure composed of two separate nitride layers ML, MR residing in the oxide under two control gate components CG_L and CG_R, respectively. The side wall polysilicon control gates CG_L and CG_R may be physically or electrically connected to form the shared control gate CG[x] polysilicon. The bit diffusion BL[x] lies beneath the oxide under the control gate CG[x]. The 2-bit nature of a cell can be realized by selecting the left or right side of a selected cell through application of specific voltages to the control gates, bit line diffusions and word gates of the selected cell and the neighbor cells. The control gate lines are unique to the twin MONOS structure and provide an extra degree of control in choosing between the left or right side of the selected cell. However, the control gate lines also require additional decoding circuitry compared to other types of dual bit cells. Appropriate voltages need to be applied to the selected control gate CGs, as well as to an override neighbor CGo. In order to select one memory storage site, it is necessary to mask the threshold of the neighboring memory storage site by an override voltage. This voltage is usually higher than that of the voltage applied to the selected control gate CGs during read. For technologies with power supplies of 1.8V and below, the override voltage VCGo is usually higher than the power supply voltage, typically in a range of 2.5 to 3.0V.

If for read or program operations, cell[X] is selected, then the corresponding control gate CGs is selected. When a memory site is targeted, then the word line adjacent to the side is also selected as WLs, and the control gate CGo on the other side of the word line is applied an override voltage VCGo.

An example of a Twin MONOS bit diffusion array is given with array version A in FIG. 1 and FIG. 2, based on U.S. Pat. No. 6,255,166 B1. This array consists of a plurality of memory cells, a plurality of word-lines 110, control gate-lines 130, and bit-lines 180 connected to the cells. One word line (WL) connects a row of N cells, the word line polysilicon connected throughout the entire word line, over and between the control gate polysilicon lines. In FIGS. 1 and 2, there are M control gate lines 130, 220 equal to the number of bit-lines, both of which are parallel to each other and perpendicular to the word lines. During any read, program, or erase mode, one in every Y cells on one WL is selected. Therefore, CG drivers and CG decoders for selecting one in every Y control gate line are connected to the memory matrix, along with BL drivers and BL decoders for selecting one in every Y bit line. WL driver and WL decoders are also connected to the matrix, which provide the correct voltages to the memory word lines for selection of one WL. Referring to FIG. 1, when MR of Cell[X] is targeted, WL is selected, CG[x] is the selected CGs, and CG[x+1] is the override CGo.

Based on U.S. patent application Ser. No. 09/810122, another array version B is described in FIGS. 3 and 4. The relationship between the rows of word lines 310, 430 and vertical bit line columns remains the same. However, in this metal bit array type, the control lines also run in parallel to the word lines, instead of the bit lines as in the diffusion bit array type Version A. Referring to FIG. 3, when MR of Cell[x] is targeted, then WL[x] is the selected word line WLs, CG[x] is the selected control gate line CGs and CG[x+1] is the override control gate line CGo. In Version A and B, one WL is selected during program and read. Also in both versions A and B, the decoders for the bit lines may be constructed so that one out of Y bit-lines are selected at the same time for 1 out of Y cells to be selected. In Version A however, for one out Y cells to be selected, the corresponding 1 out of Y control-lines need to be selected in a decoder scheme similar to the bit line's. The Version B control gate decoder is different than Version A in that only one control gate line 420 is selected with the one word line 430, with additionally only one override neighbor control gate line.

The timing to setup the voltages on targeted WL, BL, and CG in a memory matrix is of particular importance to memory performance, especially during read. Load capacitance and resistance on the lines contribute to significant delays in switching between voltage states. The main control gate lines, and word gate lines are poly gates of cells connected together which have significant resistance and capacitance, depending on the length of the array. In FIG. 4, one main bit line 480 connects an entire column of cells through the diffusion, which also carries a significant capacitance and resistance. The resistance of the bit line is generally decreased by strapping/stitching the diffusion line at intervals to a metal bit line. However, in order to achieve high density and low cost, additional metal lines for both the word and control gate poly lines are not always feasible. Therefore, the voltage set up time is defined by the slowest line. The slowest delay is usually determined by the control gate line, which is very narrow and is difficult to silicide.

Conventionally, the voltage setup time for high performance read is reduced by decreasing the capacitance of the lines, thereby decreasing the charge up time. The capacitance for any of the lines can be cut with the addition of select transistors to the lines in question, creating sub-blocks within the memory matrix and decreasing the loads for the driver and decoders for the line. For example with matrix version A, to reduce the total bit line capacitance, a main bit line can be connected to sub bit lines via select gates. Thus the cell diffusion capacitance can be reduced to that of only one sub block in the memory matrix. The same concept of sub-blocking and select transistors may be similarly applied to the control gate lines and word gate lines. However, some penalties of the select gates are larger layout area, and additional concerns about sub block lines floating when unselected, and the select transistor size having sufficient driveability for a line.

With or without select transistors, the sizes of the width of pass transistors throughout the drivers and decoders may be increased to minimize delays, but this also results in the penalty of larger layout, as well as parasitic switching current through the decoders to the voltage sources in the drivers. These voltages may be through a power supply with a considerable leakage current tolerance, but if power consumption is a vital concern such as when voltages are produced internally on a chip such as through charge pumps, then large current consumption through switching must be a consideration.

The penalties of larger switching current and layout area that come with larger pass transistor widths within the driver and decode circuits are weighed against the benefit of faster switching of voltage conditions. The set up of voltage conditions from unselected cell to selected or override cell voltages is a concern for memory performance during all of the read, program, and erase modes. Transistor sizing through the decoders however, should still be optimized for the mode where fast timing for passing voltages through the decoder is most critical, which in most cases is read. However during read, the voltage differences between selected and neighbor (or override) cells to unselected cells conditions is less extreme than that of program, and so with low driveability, the pass transistors need to be larger. If however, selected and override voltages can be applied to the correct lines without being actively passed through the decoders during read, then transistor sizing could be reduced, and optimized for the program and erase modes, in which not only is driveability higher, but set up speed is less critical.

BRIEF SUMMARY OF THE INVENTION

It is the objective of this invention to provide a circuit and semiconductor method to take advantage of control gate-word line, CG-WL capacitance coupling for using a selected word line to boost a precharged and floating neighbor control gate line voltage.

It is further an objective of this invention to avoid using voltage switching via the control gate decoders, but to use the capacitance coupling mentioned above.

It is further an objective of this invention to vary the boosted control gate voltage through the booster word line voltage and the precharged starting voltage for the boosted control gate.

It is yet another objective of this invention to provide a means of faster voltage setup on the control gate line by a combination of boosting and voltage switching.

It is yet another objective of this invention to increase the capacitance coupling ratio by boosting a single control gate line with two word gate lines.

It is another objective of this invention to reduce the boosting effect in the selected control gate line by stepping down the voltage of a third word gate.

It is still a further objective of this invention to provide another array organization in which the left and right sidewall control gate components are separated lines.

It is another objective of this invention to provide a method of using the separated CG line organization in order to increase the boosting capacitance.

It is yet another objective of this invention to provide a means of organizing even memory cells into a bank separate from odd memory cells grouped to another bank, so that control gate voltages need not switch between successive reads within a bank.

In the earlier matrix scheme for TWIN MONOS version A, a decoder and driver for control gates and a decoder and driver for bit lines were required to pass the select, override neighbor, and unselect voltage conditions on the memory cells for all modes of read, program, and erase. Decoders and drivers for the WL, BL, and CG could be used to pass the correct voltages to the matrix in version B, but the structure characteristic of version B allows an alternative to passing voltages through the decoders of the CG or WL.

Because the poly control gate lines 420, 440 are parallel to the poly word lines 430 in Version B, there is a significant capacitance between word lines and control gate lines. The selected word line 430 is always positioned between the selected control gate 420 line and the override neighbor control gate line 440 during read and program modes. Line capacitance assumptions are made for the purposes of this explanation, based on detailed calculations and simulations. The capacitance between a poly word line and an adjacent poly control gate is defined as $C_{CG\text{-}WL}$, and is depicted with other control gate capacitances in FIG. 7. About 55% of a total control gate capacitance $C_{CG}$ is between the CG and the two adjacent WL's($2*C_{CG\text{-}WL}$), and 70% of the total WL capacitance $C_{WL}$ is between the WL and both adjacent control gates ($2*C_{CG\text{-}WL}$). The coupling capacitance $C_{CG\text{-}WL}$ provides a boost capacitance $C_{CGO\text{-}WLS}$ between the boosted CGo and a selected WLs. By using a selected word line 430 to boost a pre-charged and floating neighbor control gate line 440, the voltage of the override control gate can be setup faster than by voltage switching of CGo through decoders. Also, by utilizing boosting instead of voltage switching for the override voltage, charge pumps do not need to provide high voltages during read.

(It should be noted that by similarly switching the selected or override control gates, a floating word line voltage may be boosted. But usually the control gate line delay is significantly higher than the word line delay, so no access time improvement is gained)

Although the control gate line has a higher RC delay compared to the word line, word line to control gate line coupling charges up the control gate line within the faster word line RC delay. The time required for the control gate line 440 to be boosted up to the override voltage is the same time it takes for the booster word line 430 to switch from a precharged voltage to the booster voltage. Assuming that the word line 430 switching through the decoders is faster than control line 440 switching through decoders, then capacitance boosting of the control gate is faster than charging through the control gate decoders. In this scheme, the fastest decoder transistor sizes to be optimized for read are those in the word line decoders. Fortunately, the word line decoder is usually composed of low voltage logic. Boosting a pre-charged control line not only decreases switching set up time and reduces decoder layout area, but also reduces some other problem considerations of the driver/decoder pass transistors mentioned earlier in the prior art section. Boosting a precharged voltage eliminates the need of a voltage source/chargepump to provide the boosted up control gate voltage, and the large switching current through the control gate driver and decoder from said voltage source.

In considering the capacitance boosting of a voltage, it should be noted that the boosted voltage is dependent on capacitance between the WL and CG represented by $C_{CG-WL}$, the total parasitic load capacitance on the boosted line (here $C_{CG}$), as well as the booster switching voltage (here $V_{WL}$).

DETAILED DESCRIPTION OF THE INVENTION

Figure 8:
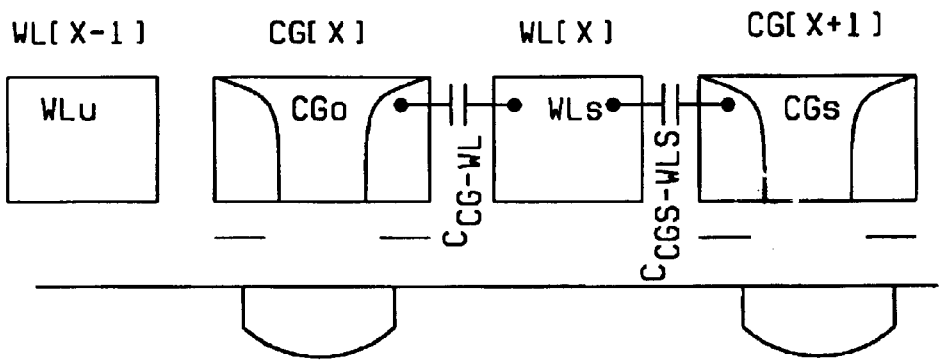
FIG. 8 shows a cross-sectional view of memory cells that correspond with FIG. 3 with the control gate and word line component selections for read. In this embodiment, one word line is targeted for switching WLs (the selected word line).

The sequence and method of WL-CG boosting is dependent on the standby voltage conditions between nodes, and the voltage conditions the word and control gate lines need to switch to for read mode. During standby mode all the lines are precharged to unselect voltages. In this explanation, the operation voltages are based on a power supply voltage VDD equal to 1.8V. For control gate lines, all lines are charged to an unselect control gate voltage VCGu=VDD (around 1.8V or below). All word lines during standby are held at unselect word line voltage VWLu=VSS (0V). Conditions for a selected cell during Read require a selected word line WLs to be raised to a selected word line voltage VWLs=VDD (1.8V), while all other unselected word lines WLu remain connected at VWLu=VSS. The conditions for the control gate during read mode require that the selected control-gate line CGs of a selected cell remain at the unselect control gate voltage VCGu=VDD, with the other unselected control-gates. It is the control gate adjacent to the selected word line, belonging to the neighbor cell adjacent to the selected side of the memory cell that requires an override control gate voltage VCGo (around 2.5V), higher than VCGu=VDD. FIG. 8 shows a cross section of a row of cells with WL[X] being selected, while CG[X] is CGo and CG[X-1] is CGs. The boost capacitance $C_{CG-WLS}$, is equal to the capacitance $C_{CG-WL}$ between a CG and an adjacent WL.

The general sequence for the selected word line WLs to boost the adjacent override control gate line CGo is as follows. First during standby mode, all word lines are charged to a low unselect voltage VWLu, and all control gate lines are charged to an unselect voltage VCGu. During read mode, the selected cell address is determined through the line decoders. The decoder for the control gate lines, keeps the selected control gate line CGs connected to the unselected voltage VCGu=VDD (1.8V) but disconnects and floats the override neighbor control gate CGo at the precharged voltage VCGu. The word line decoder then passes a select voltage VWLs to the selected word line WLs. This boosts the floating override neighbor control gate CGo to an override control gate voltage VCGo. The equation is given as $$VCGo=VCGu+(VWLs-VWLu)*C_{CGO-WLS}/C_{CG} \qquad \text{Eqn.1:}$$

It can be understood by this boosting scheme, that the control gate voltage setup time is equal to the word line setup time. Therefore, the total setup time of word and control gates is determined by the switching speed of the WLs from VWLu to VWLs.

It is recommended in this scheme, that the selected CGs line can not be floated at VCGu, but should be strongly connected in order for the selected CGs line to not be boosted when the selected WLs is raised to VWLs. For this reason, stitching may be needed and control gate decoder transistor sizing may need to be optimized. However, the decoder size to keep CG at VCGu would be smaller than if it were optimized to actively switch from VCGu to VCGo). The other control gate lines including the override neighbor line CGo besides the selected CGs line can be floated at VCGu. The other unselected control gate lines CGu besides the override neighbor control gate line CGo, may remain floating since they are not immediately adjacent to the booster WLs line, and do not experience the boosting effect like that of the CGo line.

In the second embodiment of this invention, the boosted voltage VCGo can be varied with other voltage factors of the booster voltage VWLs and the precharged starting voltage for boosting VCGu1. For a typical non-multilevel read, the override VCGo is approximately 2.5 to 3V and the VWLs is 1.8V. For multi-level read, a higher override VCGo (around 4 to 5V) may be required. VWLs remains the same for both types of read. Therefore, to increase the boosted voltage VCGo, if the VWLs remains the same, the precharged starting voltage VCGu1 must increase by a proportional amount. Originally during bi-level read, VCGu1 could be equal to the VCGu (1.8V) from standby mode. In this case, an additional step precedes the boosting sequence discussed earlier. VCGu1 for multi-level read needs to be VCGo1-VCGo higher than the standby VCGu. Therefore, before the override neighbor control gate CGo is floated, it needs to be precharged to VCGu1 through the control gate decoder. After the control gate lines are set up, then the word line decoder can function as in typical bi-level read, with the one selected word line WLs being raised from VWLu to VWLs, simultaneously boosting the Cgo from VCGu1 to VCGo1. The advantage of using another VCGu1 voltage supply rather than simply passing the override voltage VCGo directly through the decoders is that a lower voltage supply/chargepump could be implemented. Additionally, there is lower switching current from the VCGu1 voltage supply. Depending on the additional time it takes for the override control gate CGo to precharge from standby VCGu to VCGu1, the boosting method may still be faster than charging the CGo line from VCGu to VCGo through the control gate.

While the focus of WLs-CGo boosting was for a quick read, it has potential for any mode where one WLs is switched high, and charging the CGo line can been be done quickly. During program voltage conditions, as in read, one WLs is selected high from the other WLu lines remaining at VWLu=VSS. Additionally, the unselected CGu lines remain at VCGu=VDD (1.8V) and the override VCGo needs be VCGo (~3V). The only difference in the control gate and word line voltage conditions for program from bi-level read is that the selected control gate line CGs is a high VCGs=6V instead of remaining at standby VCGu=VDD. Therefore while the control gate decoder floats the override CGo line, the decoder may pass a strong VCGs voltage to the selected CGs line. While the WLs boosts the CGo line, the strong VCGs connection through the decoder to the CGs line is maintained. The quicker CGo charging to VCGo is still an advantage with this boosting method for program. Even though a high voltage supply is required to pass VCGs through the control gate decoder, because the VCGs is higher than VCGo, the driving force through the decoder is larger and requires smaller pass transistors than if VCGo were passed through the decoder in addition to VCGs.

In the third embodiment of this invention, a combination of boosting and charging through the decoder can be implemented. The boosting variations of this invention may be applied to the CG override line at the same time that a fixed voltage is applied through a control gate decoder circuit. The fixed voltage that is applied can be but does not necessarily have to be equal to the boosted voltage.

The previous embodiments use one selected WLs to boost a neighbor CGo as shown in FIG. 8. The final voltage VCGo is dependent on the $C_{CGO\text{-}WLS}$ over the total $C_{CG}$. The next four embodiments will describe methods to increase the VCGo voltage by increasing the ratio.

Figure 9:
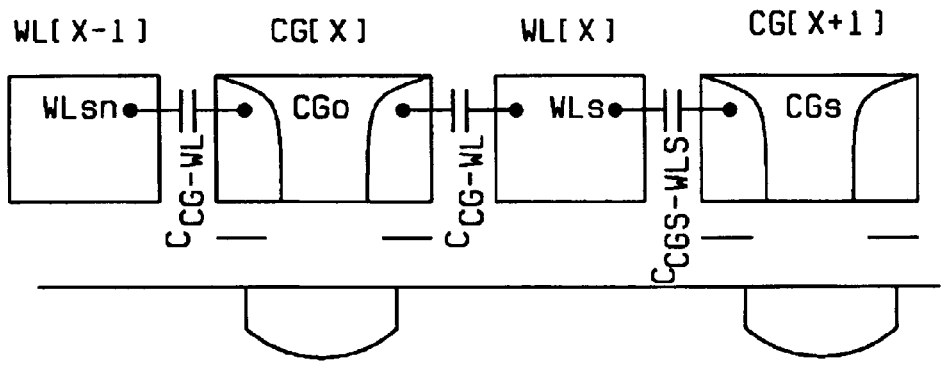
FIG. 9 shows a cross-sectional view of memory cells that correspond with FIG. 3 with the control gate and word line component selections for read. In this embodiment, two word lines are targeted for switching which includes the selected word line WLS, and an additional override neighbor word line WLns.

In the fourth embodiment of this invention, the $C_{CGO\text{-}WLS}$ over the total $C_{CG}$ ratio can be increased by using two WL's to boost the CGo instead of only one WL. When WL's are switched from VWLu to VWLs, $C_{CGO\text{-}WLS}$ is equal to $2*C_{CG\text{-}WL}$, as shown in FIG. 9. For example, if WL[X] is selected WLs, and CG[X] is the CGo neighbor, then WL[X-1] should also be selected to be switched on through the decoder as WLsn. If WL[X] is selected WLs, and CG[X+1] is the CGo neighbor, then WL[X+1] is selected to be switched through the decoder as WLsn. Another advantage of boosting with the additional WL is that VCGo increases without the undesirable side effect of further boosting of the unselected neighbor VCGu by WL[X]. To increase the boosting capacitance $C_{CG\text{-}WLS}$, WLsn need not be switched to VWLs but to a different value VWLsn. If VWLsn is less than VWLs, then $C_{CGO\text{-}WLS}$ is less than $2*C_{CG\text{-}WL}$.

Figure 10:
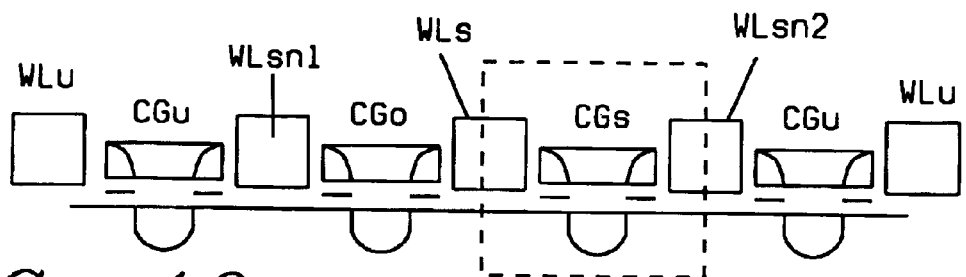
FIG. 10 shows a cross-sectional view of memory cells that correspond with FIG. 3 with the control gate and word line component selections for read. In this embodiment, three word lines are targeted for switching which includes the selected word line WLs, and an override neighbor word line WLns1, and an additional select neighbor word line WLns2.

In the fifth embodiment of this invention, two WL's (WLs and WLsn1) are used to boost up the CGo, and a third WL (WLsn2) is used to boost down the CGs. This method addresses the issue of unwanted boosting of CGs. The cross sectional representation is shown in FIG. 10.

The method of WL-CG boosting may be used in any matrix where $C_{CG\text{-}WL}/C_{CG}$ is sufficient (particularly when CG lines are parallel to word lines).

Figure 1:
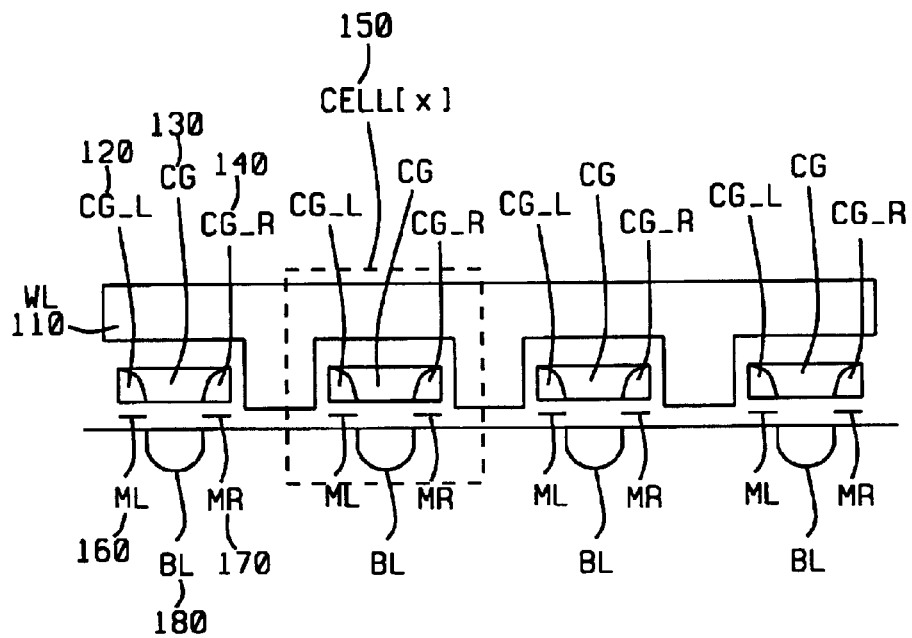
FIG. 1 shows a prior art cross-sectional view of a MONOS memory cell.
Figure 2:
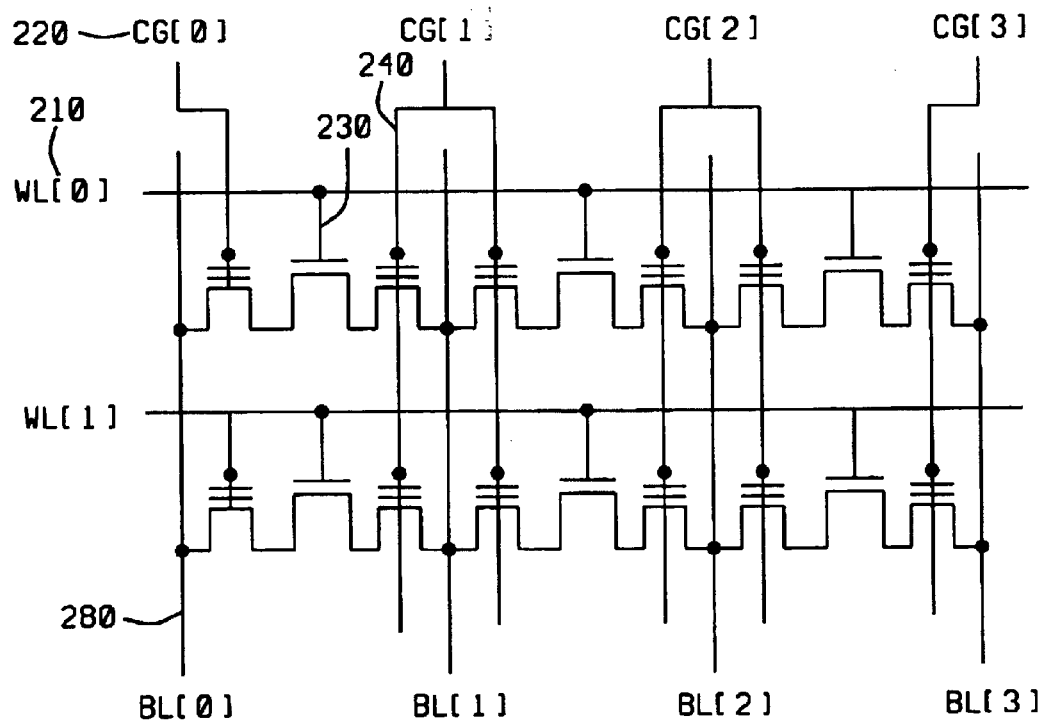
FIG. 2 shows a prior art circuit diagram which corresponds to the cross-sectional view of the MONOS memory cell of FIG. 1.
Figure 3:
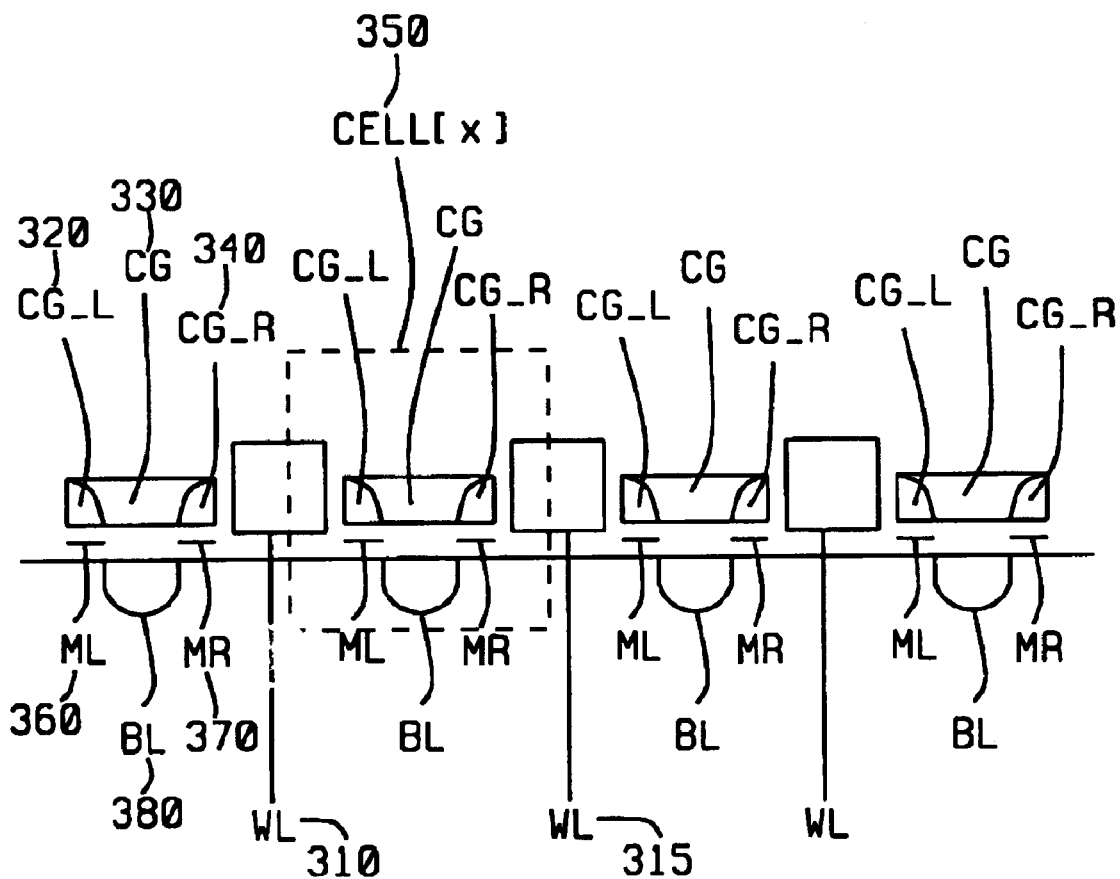
FIG. 3 shows a cross-sectional view of the MONOS memory cell of this invention.
Figure 4:
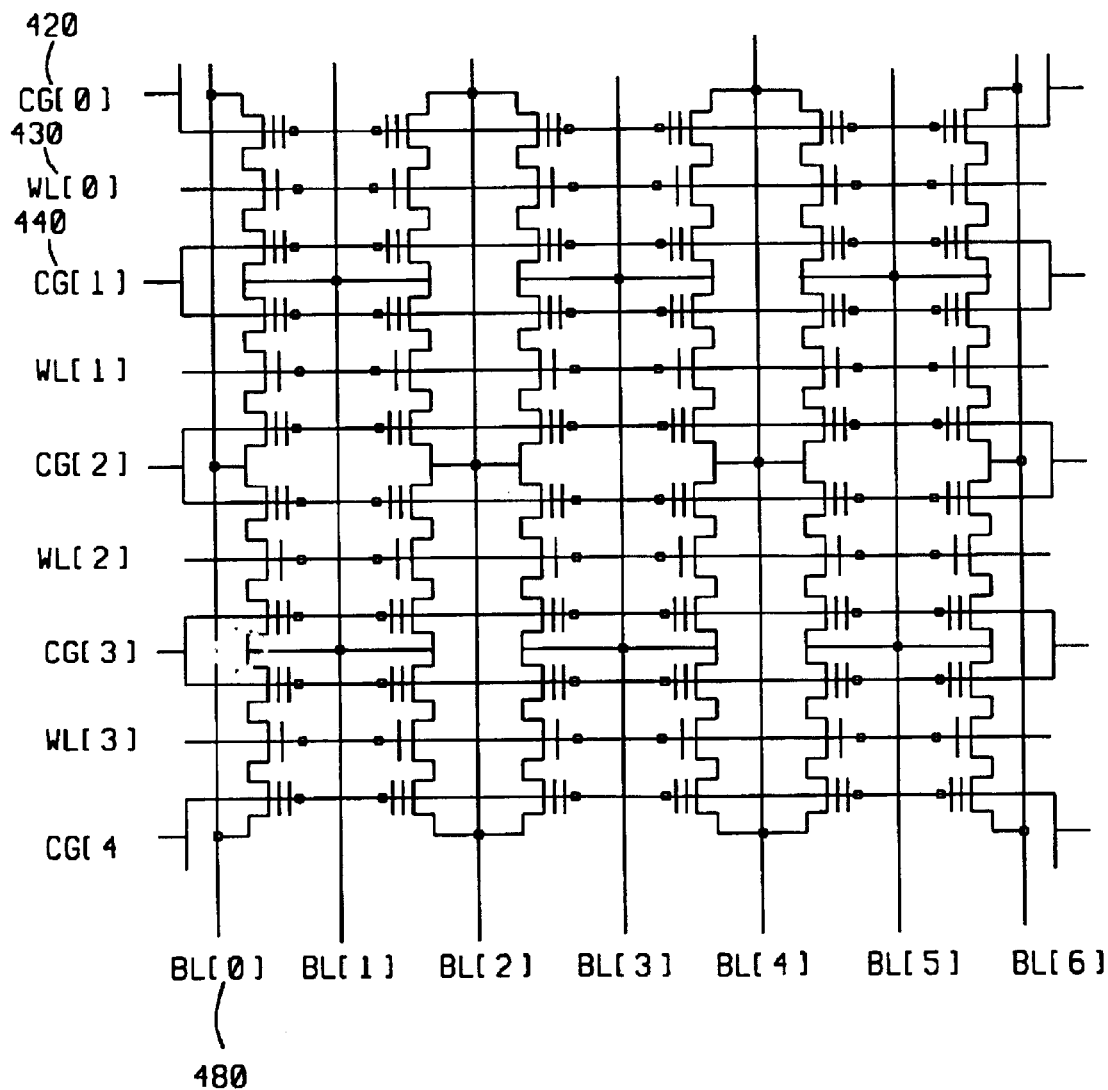
FIG. 4 shows a circuit diagram which corresponds to the cross-sectional view of the MONOS memory cell of this invention in FIG. 3.
Figure 5:
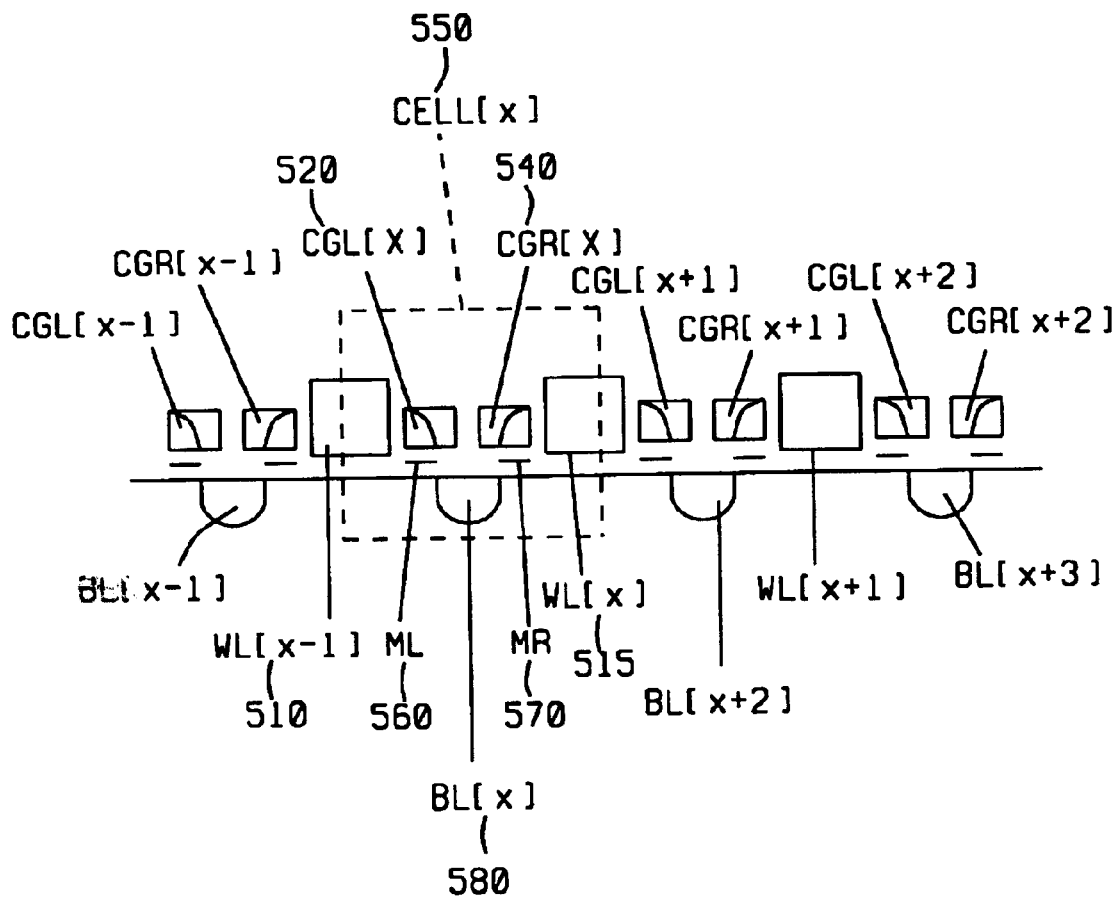
FIG. 5 shows a cross-sectional view of another array embodiment of MONOS memory cell of this invention.
Figure 6:
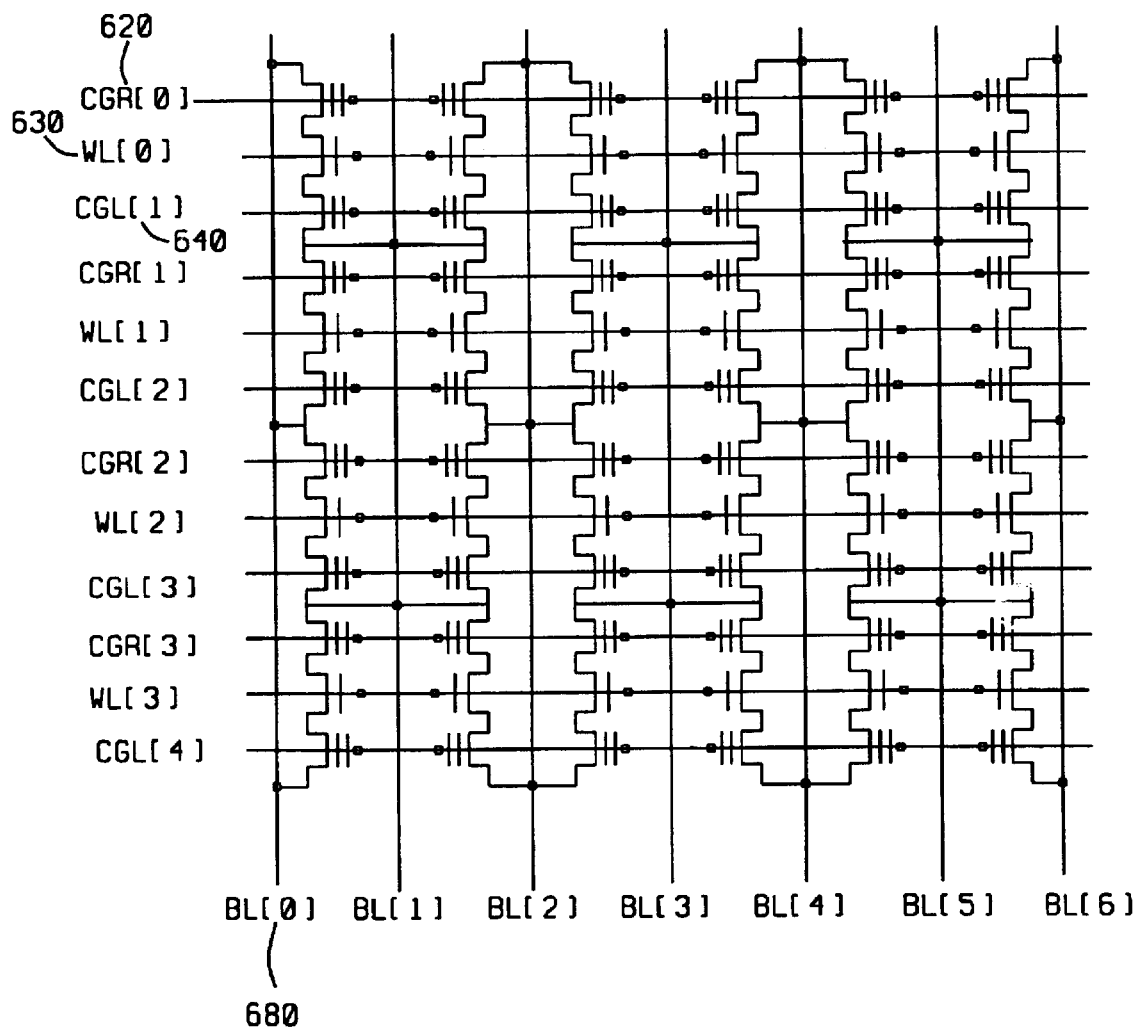
FIG. 6 shows a circuit diagram which corresponds to the cross-sectional view of the MONOS memory cell of this invention in FIG. 5.
Figure 7:
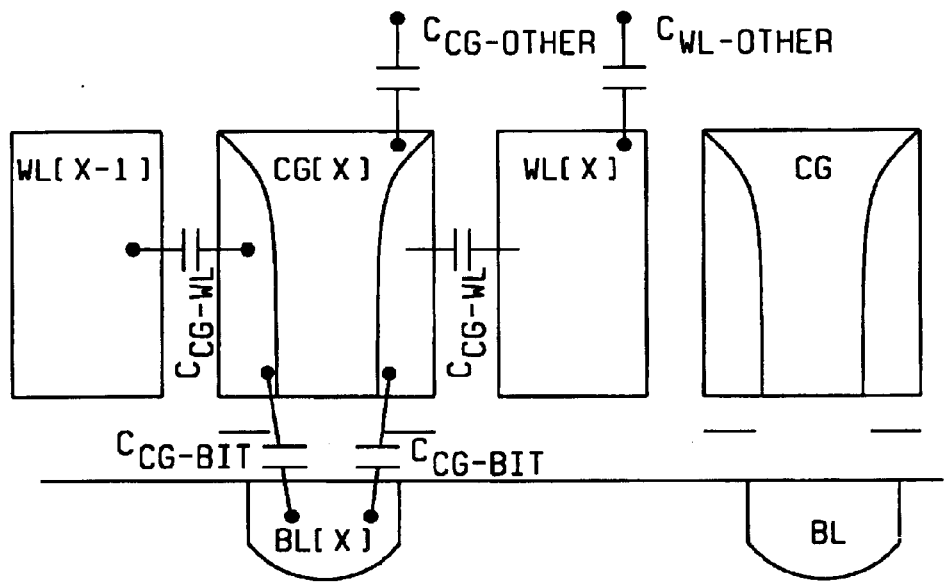
FIG. 7 shows a cross-sectional view of memory cells with the capacitance components on a CG[X] and WL[X] of a memory cell [X] that correspond to FIG. 3.
Figure 12:
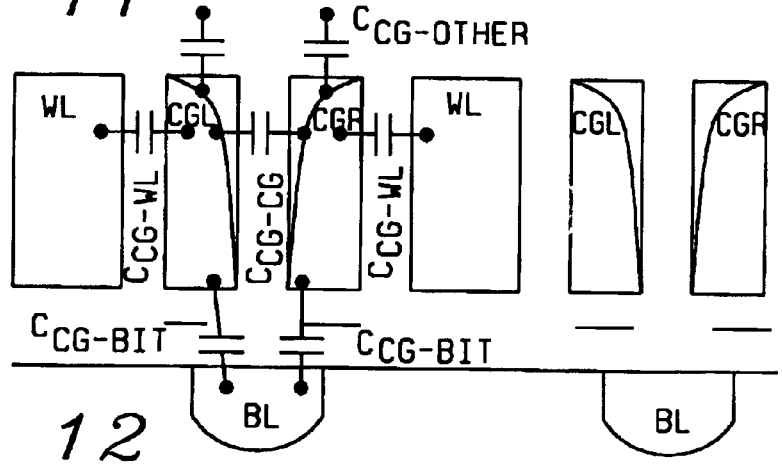
FIG. 12 shows a cross-sectional view of memory cells with the capacitance components on a CG[X] and WL[X] of a memory cell[X] that correspond to FIG. 6.
Figure 13:
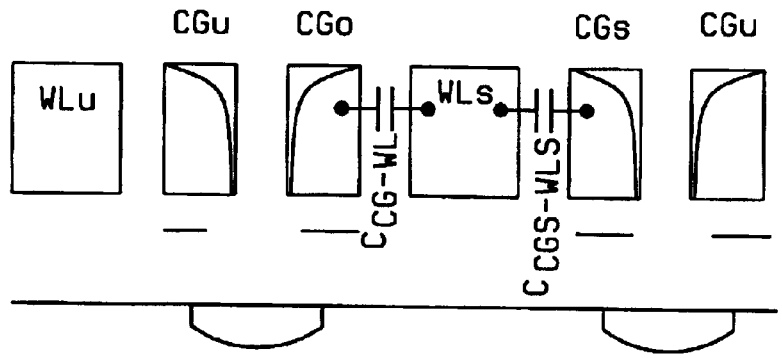
FIG. 13 shows a cross-sectional view of memory cells that correspond with FIG. 6 with the control gate and word line component selections for read. In this embodiment, one word line is targeted for switching WLS (the selected word line).

In a sixth embodiment of this invention, the boosting ratio is increased by a different matrix organization scheme, shown as Version C in FIG. 5 and FIG. 6. In this matrix, a memory cell Cell[X] (550) is comprised of 2 separate control gates CGL (520) and CGR (540), under which the two separate nitride layers, ML (560) and MR (570), reside. The CGL's in a row of cells are connected together to form a CGL line, and the CGR's in a row of cells are connected together to form a CGR line. Because the CGL and CGR are separated, then the total $C_{CG}$ capacitance of a CG (620) line is cut nearly in half as shown in FIG. 12. Thus, the $C_{CGO\text{-}WLS}/C_{CG}$ is nearly doubled, and boosting of CGo may be also doubled. However, because the boosting ratio is the same for all CG lines, (FIG. 13) then unwanted boosting of neighbor unselected CGu is also doubled. Hence, more stitching and/or larger decoder sizes for the CG may be required to limit the unwanted boosting of CGu.

Figure 11:
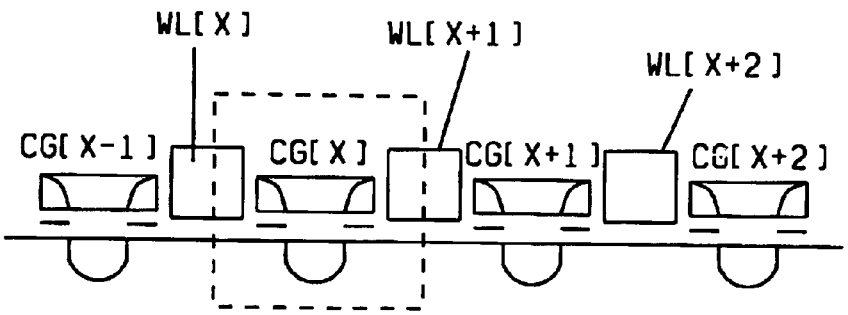
FIG. 11 shows a cross-sectional view of memory cells that correspond with FIG. 3 with another embodiment for control gate selections for reading cell[X].

In a seventh embodiment of this invention, CG voltages are already setup before the read operation. Advantages with boosting such as quick word line switching determining CG/WL setup time, are also seen when fixed CG voltages are applied through the decoder, with no switching. In the memory array matrix of version B, FIG. 11, if an even memory cell (X is even) with selected CG[X] is to be read, then odd CG lines CG[ . . . ,X−1,X+1, . . . ], may be charged to VCGo, and even lines CG[ . . . ,X,X+2. . . ] may be charged to VCGu. Conversely, if an odd memory cell (X is odd) with corresponding odd selected CG[X] is to be read, then all even CG lines may be charged to VCGo and all odd lines are charged to VCGu. Thus, all even memory cells corresponding to even CG's, may be grouped into a bank, while all odd memory cells corresponding to odd CG's, may be grouped into another bank. Read within a bank would require only switching of WLs and bit lines, but reading between the two banks would require switching the VCGo and VCGu voltage sources between even and odd CG lines.

The advantages of the circuits and procedures provided in this invention iare address decoder silicon area reduction, control lines voltage setup time reduction for high performance read, and elimination of high voltage supplies/chargepumps during read.

While this invention has been particularly shown and described with Reference to the preferred embodiments thereof, it will be understood by those Skilled in the art that various changes in form and details may be made without Departing from the spirit and scope of this invention.

What is claimed is:

1. A control gate and word line voltage boosting circuit for twin MONOS, metal oxide nitride oxide semiconductor memory cell comprising:

a word line, which is placed over a thin oxide, a control gate-left, which is placed over a nitride implant, in said thin oxide, a control gate-right, which is placed over another nitride implant, in said thin oxide, and a bit-line, which is in diffusion under said oxide, wherein said control gate left and said control gate right forming a 2-bit cell, wherein said 2-bit cell is made up of a left side bit and a right side bit, wherein said left side bit can be selected through application of specific voltages on a neighboring cell's control gate or bit line, different from selected cell's voltages and other selected cell's voltages.

2. The control gate and word line voltage boosting circuit for twin MONOS memory cells of claim 1 wherein said word line contains a parasitic capacitance formed by the word line polysilicon over thin oxide.

3. The control gate and word line voltage boosting circuit for twin MONOS memory cells of claim 1 wherein said control gate adjacent to said word line contains a parasitic capacitance formed by the control gate polysilicon over said nitride and oxide layers.

4. The control gate and word line voltage boosting circuit for twin MONOS memory cells of claim 1 wherein said capacitive coupling between said word line and said adjacent control gate results in a voltage boost on said word line.

5. The control gate and word line voltage boosting circuit for twin MONOS memory cells of claim 1 wherein said specific voltages on said neighboring bit line can be boosted or raised to required levels via capacitive coupling between said selected word lines and said neighboring bit lines.

6. The control gate and word line voltage boosting circuit for twin MONOS memory cells of claim 1 wherein said voltages on said neighboring control gates can be boosted or raised to required levels via capacitive coupling between said selected word lines and said neighboring control gate lines.

7. The control gate and word line voltage boosting circuit for twin MONOS memory cells of claim 1 wherein said control gates are physically placed parallel to said word lines so as to facilitate said capacitive coupling between selected word lines and neighboring control gates.

8. The control gate and word line voltage boosting circuit for twin MONOS memory cells of claim 1 wherein selected or transfer gates are placed periodically along bit lines of the memory away so as to partition the capacitive of said bit lines to smaller values.

9. The control gate and word line voltage boosting circuit for twin MONOS memory cells of claim 1 wherein said partitioning of said bit line results is a low bit line capacitor, which results in decreased set-up time for changing voltages for the program, erase & read memory modes.

10. The control gate and word line voltage boosting circuit for twin MONOS memory cells of claim 1 wherein selected or transfer gates are placed periodically along control gate line of the memory array so as to partition the capacitance of said control gate line to smaller values.

11. The control gate and word line voltage boosting circuit for twin MONOS memory cells of claim 1 wherein said partition of said control gate lines results in lower control gate line capacitances, which results in decreased set-up time for changing voltages for the program, erase and read memory modes.

12. A control gate and word line voltage boosting method for twin MONOS, metal oxide nitride oxide semiconductor memory cell comprising the steps of:

including a word line, which is placed over a thin oxide, including a control gate-left, which is placed over a nitride implant, in said thin oxide, including a control gate-right, which is placed over another nitride implant, in said thin oxide, and including a bit-line, which is in diffusion under said oxide, wherein said control gate contains said control gate left and said control gate right forming a 2-bit cell, wherein said 2-bit cell is made up of a left side bit and a right side bit, wherein said left side bit can be selected through application of selected voltages on a neighboring cell's control gate or bit line, different from selected cell's voltages and other unselected cell's voltages.

13. The control gate and word line voltage boosting method for twin MONOS memory cells of claim 12 wherein said word line contains a parasitic capacitance formed by the word line polysilicon over thin oxide.

14. The control gate and word line voltage boosting method for twin MONOS memory cells of claim 12 wherein said control gate adjacent to said word line contains a parasitic capacitance formed by the control gate polysilicon over said nitride and oxide layers.

15. The control gate and word line voltage boosting method for twin MONOS memory cells of claim 12 wherein said capacitive coupling between said word line and said adjacent control gate results in a voltage boost on said word line.

16. The control gate and word line voltage boosting method for twin MONOS memory cells of claim 12 wherein said specific voltages on said neighboring bit line can be boosted or raised to required levels via capacitive coupling between said selected word lines and said neighboring bit lines.

17. The control gate and word line voltage boosting method for twin MONOS memory cells of claim 12 wherein said voltages on said neighboring control gates can be boosted or raised to required levels via capacitive coupling between said selected word lines and said neighboring control gate lines.

18. The control gate and word line voltage boosting method for twin MONOS memory cells of claim 12 wherein said control gates are physically placed parallel to said word lines so as to facilitate said capacitive coupling between selected word lines and neighboring control gates.

19. The control gate and word line voltage boosting method for twin MONOS memory cells of claim 12 wherein selected or transfer gates are placed periodically along bit lines of the memory away so as to partition the capacitive of said bit lines to smaller values.

20. The control gate and word line voltage boosting method for twin MONOS memory cells of claim 12 wherein said partitioning of said bit line results is a low bit line capacitor, which results in decreased set-up time for changing voltages for the program, erase & read memory modes.

21. The control gate and word line voltage boosting method for twin MONOS memory cells of claim 12 wherein selected or transfer gates are placed periodically along control gate line of the memory array so as to partition the capacitance of said control gate line to smaller values.

22. The control gate and word line voltage boosting method for twin MONOS memory cells of claim 12 wherein said partition of said control gate lines results in lower control gate line capacitances, which results in decreased set-up time for changing voltages for the program, erase and read memory modes.

* * * * *

UNITED STATES PATENT AND TRADEMARK OFFICE
CERTIFICATE OF CORRECTION

PATENT NO. : 6,735,118 B2
DATED : May 11, 2004
INVENTOR(S) : Nori Ogura and Seiki Ogura It is certified that error appears in the above-identified patent and that said Letters Patent is hereby corrected as shown below:

Title page,
Item [75], delete "Seki Ogura, Hopewell Jct., NY (US)" and replace it with
-- Seiki Ogura, Hopewell Jct., NY (US) --.

Signed and Sealed this

Thirtieth Day of November, 2004

JON W. DUDAS
*Director of the United States Patent and Trademark Office*